(12) United States Patent
Coates

(10) Patent No.: US 9,653,759 B2
(45) Date of Patent: May 16, 2017

(54) METHOD AND APPARATUS FOR OPTIMIZED BATTERY LIFE CYCLE MANAGEMENT

(75) Inventor: Dwaine Coates, Huntington Beach, CA (US)

(73) Assignee: The Boeing Company, Chicago, IL (US)

(*) Notice: Subject to any disclaimer, the term of this patent is extended or adjusted under 35 U.S.C. 154(b) by 1164 days.

(21) Appl. No.: 13/433,646

(22) Filed: Mar. 29, 2012

(65) Prior Publication Data

US 2013/0260188 A1    Oct. 3, 2013

(51) Int. Cl.
*H02J 7/00* (2006.01)
*H01M 10/42* (2006.01)
*G01R 31/36* (2006.01)
*G01R 31/00* (2006.01)

(52) U.S. Cl.
CPC .......... *H01M 10/42* (2013.01); *G01R 31/008* (2013.01); *G01R 31/3651* (2013.01); *G01R 31/3679* (2013.01); *H01M 2010/4271* (2013.01)

(58) Field of Classification Search
CPC ..................................................... H01M 10/42
See application file for complete search history.

(56) References Cited

U.S. PATENT DOCUMENTS

| | | | | |
|---|---|---|---|---|
| 6,331,761 B1* | 12/2001 | Kumar | ............. | H01M 10/4257 320/132 |
| 8,825,417 B1* | 9/2014 | Krolak | ............. | H01M 10/4207 320/134 |
| 2002/0120906 A1* | 8/2002 | Xia | ............. | G01R 31/3651 716/111 |
| 2008/0012535 A1* | 1/2008 | Takatsuji | ............. | B60L 3/0046 320/150 |
| 2010/0121587 A1* | 5/2010 | Vian | ............. | G01R 31/3651 702/63 |
| 2010/0121591 A1* | 5/2010 | Hall | ............. | G01R 31/3651 702/63 |
| 2010/0318252 A1* | 12/2010 | Izumi | ............. | B60K 6/28 701/22 |

* cited by examiner

*Primary Examiner* — Robert Grant
(74) *Attorney, Agent, or Firm* — Kunzler Law Group, PC

(57) ABSTRACT

Method and apparatus for optimized battery life cycle management are described. A battery management system (BMS), comprising a battery, identifies battery-specific factors with associated environmental conditions, and battery history profiles at a current time instant. The BMS measures current, voltage, and/or power of the battery instantaneously. The resulting battery measurements, the battery-specific factors with associated environmental conditions, and the battery history profiles, formed as battery dynamic situations at the current time instant, may be time stamped for estimating an instantaneous battery state of the battery. The time stamped battery dynamic situations may be aggregated for long-term trend analysis for the battery state. The instantaneous battery state estimate is updated by comparing with the long-term trend analysis to manage battery charging or discharging. The battery operating conditions are determined based on the updated battery state estimate. The BMS may manage system power consumptions based on the determined battery conditions.

18 Claims, 4 Drawing Sheets

METHOD AND APPARATUS FOR OPTIMIZED BATTERY LIFE CYCLE MANAGEMENT

FIELD

Embodiments described herein relate to life cycle management of batteries. More specifically, certain specific embodiments described herein relate to an apparatus (system) and method for optimized battery management over a life cycle of one or more batteries.

BACKGROUND

Devices such as mobile phones, laptop computers, power tools, and toys often rely on electrical battery energy. In addition, many devices associated with the aerospace and marine industries utilize battery power at one time or another. At least one type of electrical batteries store chemical energy and deliver electrical energy through an electrochemical conversion process. A typical battery of this type consists of one or more cells, organized in an array. Each cell consists of an anode, a cathode, and the electrolyte that separates the two electrodes and allows the transfer of electrons as ions between them. Chemical material that originates chemical reactions within the cell is called active material. In practice, the energy that can be obtained from a cell is fundamentally limited by the quantity of active material contained in the cell.

Electrical batteries may be non-rechargeable or rechargeable. Although some devices may use non-rechargeable batteries, the vast majority depend on rechargeable batteries. Batteries with one or more features such as a capacity to be recharged, a long lifetime, a light weight, and a small size are highly desirable in many applications. Accordingly, there is a need for systems and methods for battery life cycle management.

Further limitations and disadvantages of conventional and traditional approaches will become apparent to one of skill in the art, through comparison of such systems with some aspects of the described embodiments as set forth in the remainder of the present application with reference to the drawings.

BRIEF SUMMARY

In one aspect, a method for life cycle management of a battery is provided. The method includes receiving data, at a battery life cycle management system, the data including a plurality of current time instant operating factors associated with a battery, accessing a historical profile associated with the battery, estimating a state for the battery using the received data and the historical profile, and managing operation of the battery based on the estimated state.

In another aspect, a battery life cycle management system is provided. The system includes one or more processors, a memory communicatively coupled to the one or more processors, and at least one data acquisition unit communicatively coupled to the one or more processors and comprising an interface to a battery to be life cycle managed. The one or more processors are operable to receive data from the at least one data acquisition unit, the data including a plurality of current time instant operating factors associated with the battery, access a historical profile associated with the battery stored within the memory, estimate a state for the battery using the received data and the historical profile, and manage operation of the battery based on the estimated state.

In still another aspect, an aircraft is provided that includes at least one battery deployed therein, at least one unit within the aircraft operable to utilize power supplied by the at least one battery during at least a portion of an operating cycle associated with said unit, and a battery life cycle management system coupled to said at least one battery. The battery life cycle management system is operable to receive data including a plurality of current time instant operating factors associated with the at least one battery, access a historical profile associated with the at least one battery stored within the battery life cycle management system, estimate a state for the at least one battery using the received data and the historical profile, and manage operation of the at least one battery based on the estimated state.

The features, functions, and advantages that have been discussed can be achieved independently in various embodiments or may be combined in yet other embodiments, further details of which can be seen with reference to the following description and drawings.

DETAILED DESCRIPTION

Certain embodiments described herein may be found in an apparatus (system) and method for battery life cycle management. In various embodiments, a battery life cycle management system (BMS) that is associated with a battery, for example, a rechargeable battery, may identify one or more instantaneous battery-specific factors, associate such factors with environmental conditions, and store such data as a battery history profile. The BMS relates these factors, conditions, and data from prior generated profiles to battery operating conditions at a current time instant, to estimate a state of the battery. The BMS may be operable to measure instantaneous current, voltage, impedance, and/or power associated with the rechargeable battery. The battery measurements, the battery-specific factors with associated environmental conditions and the data from battery history profiles may be combined to form battery dynamic situations that correspond to the current time instant. These battery dynamic situations may be time stamped so as to allow estimation of a current state of the rechargeable battery at the current time instant. The time stamped battery dynamic situations and/or state estimations may be aggregated over time to generate a long-term trend analysis of the state of the battery.

The battery state estimate at the current time instant may be updated by comparing with the long-term trend analysis of the battery state. Charging and discharging of the rechargeable battery at the current time instant, or at a future time, may be managed or controlled based on the updated battery state estimate. Various battery operating conditions at the current time instant may be determined utilizing the updated battery state. System power consumptions within the BMS may be managed based on the determined battery conditions. The battery state at a different time instant may vary depending on the corresponding battery dynamic situations captured at the different time instant.

Figure 1:
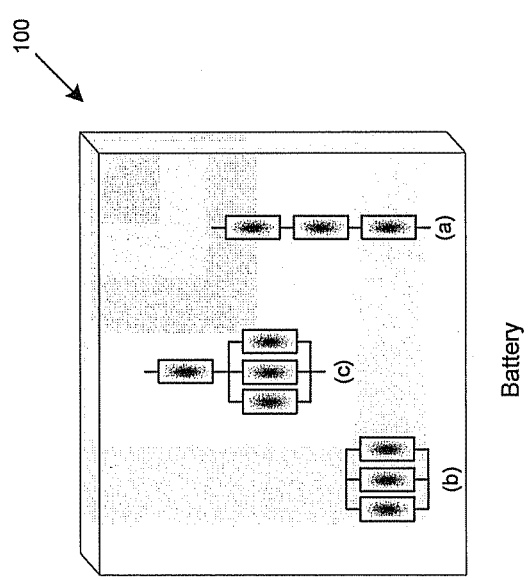
FIG. 1 is a diagram that illustrates one embodiment of an exemplary rechargeable battery.

FIG. 1 is a diagram that illustrates one embodiment of an exemplary rechargeable battery. Referring to FIG. 1, there is shown a rechargeable battery 100, which may comprise suitable battery cells, logic, circuitry, interfaces and/or code that may be operable to convert chemical energy into electrical energy and vice versa. The rechargeable battery 100 may provide the electrical energy to various applications such as high end platforms utilized in commercial applications, aerospace applications, military applications, and/or space applications. The rechargeable battery 100 may be operable to read or receive electric current flowing from a battery charger into the rechargeable battery 100. The rechargeable battery 100 may be configured to output a current to loads to support application platforms such as, for example, mobile phones, camcorders, portable audio products and laptop computers as well as any number of aerospace applications. The current flow inside the rechargeable battery 100 may be supported by active material contained in one or more battery cells. In this regard, the battery cells may be connected or arranged in either a series, parallel, or series/parallel combination, as shown in 110(a), (b), and (c), respectively, so as to achieve the required voltage(s), current(s), and/or capacity. For example, as shown in 100(a), three battery cells, each having a cell voltage of 1.2 volts, may be configured to be connected in series such that the rechargeable battery 100 provides a voltage of 3.6 volts.

The state of the rechargeable battery 100 may be described or characterized by various parameters such as State of Charge (SOC), State of Health (SOH), and/or State of Life (SOL). The SOC may indicate the charge level of the rechargeable battery 100. The units of the SOC may be percentage points such like 0%=empty and 100%=full, for example. In other words, the SOC provides an indication of the percentage of maximum possible charge that is present inside the rechargeable battery 100. The SOH may represent a measure of the battery's ability to store and deliver electrical energy over the life span of the rechargeable battery 100. As the battery continues to age, the capacity to accept a charge, for example, may further degrade. At some point, the SOH may indicate that the rechargeable battery 100 is unhealthy, meaning the rechargeable battery 100 is unable to store and deliver energy for proper operation of an application platform and therefore must be replaced. The SOL may indicate a life span of the rechargeable battery 100. Battery aging comprises a complex process that involves many battery-specific parameters such as, for example, impedance(s), conductance(s), and capacity(ies) as well as any environmental factors associated the platform in which the battery is being utilized.

Battery performance metrics or optimal operating conditions may be determined or evaluated utilizing the state of the rechargeable battery 100. The battery operating conditions may comprise information such like remaining battery capacity, how much battery operating time is left, remaining battery life based on a specific discharge rate, capacity for recharging, whether the rechargeable battery 100 may provide adequate power for an additional load, and/or whether the rechargeable battery 100 may provide a specified amount of additional power to perform a task. Accurate estimate of the battery state may improve the battery performance and reliability, and may ultimately lengthen the battery lifetime. For example, an accurate SOC determination may allow the rechargeable battery 100 to be used within the design limits, so the battery pack does not need to be over-engineered. This may allow a smaller, lighter battery, which costs less. A poor reliability of the SOC estimate, however, may induce the use of only part of the available battery capacity. This may lead to more frequent recharging than strictly necessary, which in turn leads to an earlier wear-out of the battery. In this context, accurate battery state estimate is desirable to ensure appropriate battery operating condition reporting so as to support desired operation of the application platform.

Figure 2:
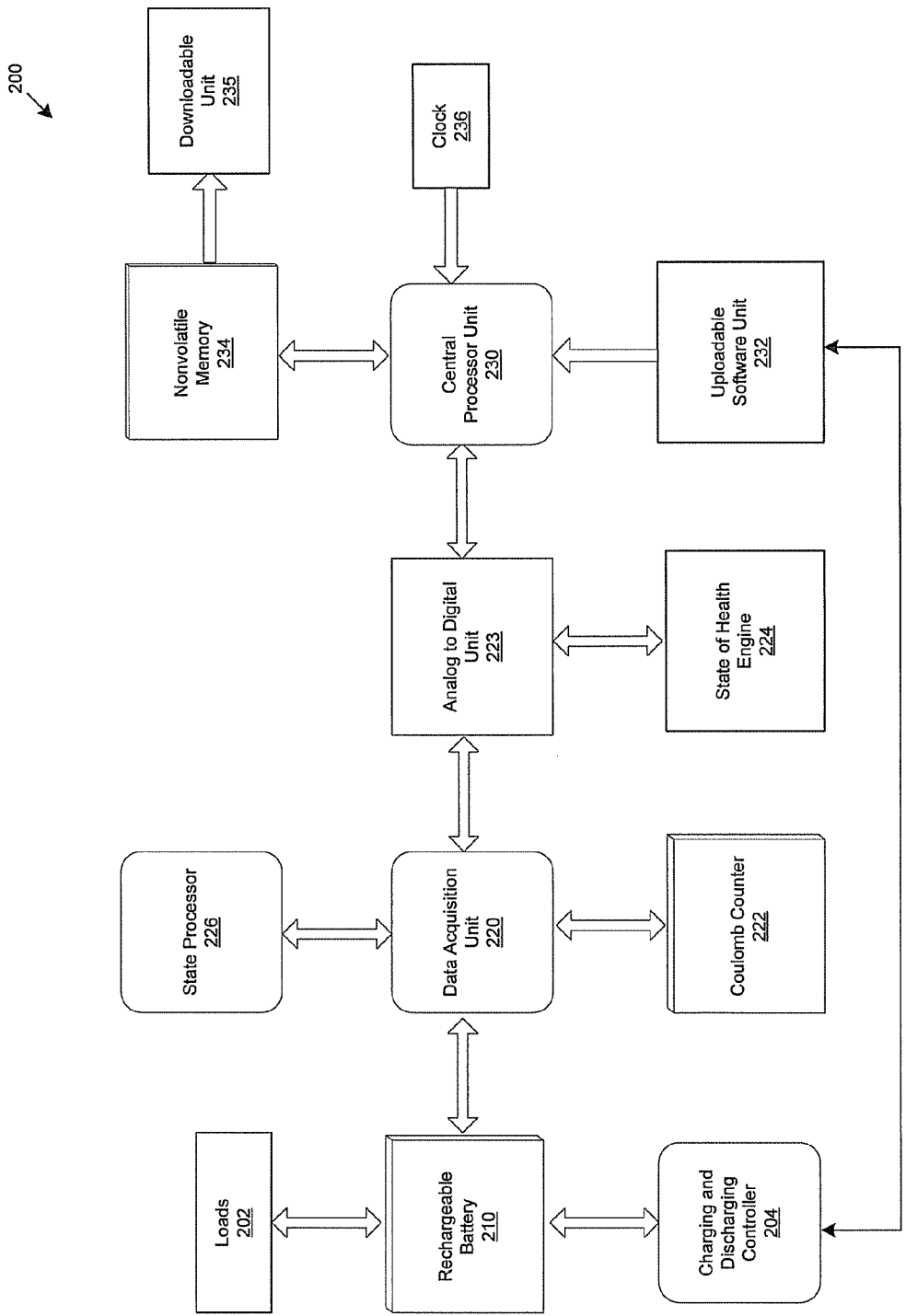
FIG. 2 is a block diagram that illustrates an exemplary battery life cycle management system, in accordance with an illustrative embodiment.

FIG. 2 is a block diagram that illustrates an exemplary battery life cycle management system, in accordance with an illustrative embodiment. Referring to FIG. 2, there is shown a battery management system (BMS) 200, which comprises a rechargeable battery 210 utilized to provide electrical power to loads 202. The BMS system 200 further includes a charging and discharging controller 204, a data acquisition unit 220, a coulomb counter 222, an analog to digital (A/D) unit 223, a state of health (SOH) engine 224, a state processor 226, a central processor unit 230, an uploadable software unit 232, a nonvolatile memory 234, a downloadable unit 235, and a clock 236.

The rechargeable battery 210 may be capable of converting of chemical energy into electrical energy to provide power to and support application platforms. The operation of the rechargeable battery 210 may be dynamic and its performance may vary with dynamic battery situations. The dynamic battery situations for the rechargeable battery 210 may comprise battery-specific factors, associated environmental conditions such as temperature and/or temperature gradients, battery measurements such as cell load voltage(s), cell open circuit voltage(s), and/or cell loaded DC impedance(s), and battery history profiles. The battery-specific factors may comprise battery impedance, battery conductance, battery capacity, battery age, battery refreshment discharge, charge and discharge efficiencies, charge and discharge rates, overcharging, overdischarging, and/or battery cycle life, captured or detected at any given instantaneous moment in time during the battery's useful life. The environmental conditions may comprise battery temperature(s), humidity(ies), air pressure(s), load characteristics, and/or other environmental conditions that influence battery performance and/or capacity. The battery measurements may comprise measurements on battery voltage, current, impedance, DC impedance, power, and/or capacity. The battery history profiles may comprise records of cycle count, user pattern, maintenance requirements, the number of charges, the number of discharges, the number of charge-discharge cycles, the difference between the actual battery capacity and discharge capacity, and/or the occurrence of a refreshment discharge since previous refreshment discharge, for example.

The rechargeable battery 210 may operate in a charge cycle or in a discharge cycle. The rechargeable battery 210 may be charged or discharged at various rates. The charge and discharge rates for the rechargeable battery 210 may be determined and controlled by the charging and discharging controller 204. The charging and discharging controller 204 may comprise suitable logic, circuitry, interfaces and/or code that may be operable to manage and control charging or discharging of the rechargeable battery 210. In this regard, the charging and discharging controller 204 may be operable to monitor current flowing from and to the rechargeable battery 210. The charging and discharging controller 204 may coordinate with the central processor unit 230 to start or terminate charging or discharging of the rechargeable battery 210.

In an exemplary embodiment, the charging and discharging controller 204 may signal or instruct the rechargeable battery 210 to start or terminate a charge cycle or a discharge cycle based on the battery dynamic situations such as battery-specific factors, associated environmental conditions, battery measurements, and/or battery history profiles. During the charge cycle, the BMS system 200 may receive electrical energy supplied from various electrical sources such as an electrical wall outlet for the charging of rechargeable battery 210. The rechargeable battery 210 may accumulate the received electrical energy over a period of time. During the discharge cycle, the rechargeable battery 210 may provide the accumulated electrical energy to the loads 202. The loads 202 may comprise suitable logic, circuitry, interfaces and/or code that may be operable to convert the electrical energy supplied by the rechargeable battery 210 into an energy form that may fulfill the loads' function, for example, mechanical energy, light, sound, heat, and/or electromagnetic (EM) radiation.

The data acquisition unit 220 may comprise suitable logic, circuitry, interfaces and/or code that may be operable to track battery dynamic situations related to the operation of the rechargeable battery 210. In this regard, the data acquisition unit 220 may be operable to track battery-specific factors, associated environmental conditions, and battery history profiles for the rechargeable battery 210. For example, the data acquisition unit 220 may measure charge and discharge current, terminal voltage, power and/or capacity of the rechargeable battery 210. The data acquisition unit 220 may track the environmental conditions such as battery temperature, and/or humidity for the rechargeable battery 210.

The coulomb counter 222 may comprise suitable logic, circuitry, interfaces and/or code that may be operable to determine or calculate battery capacity in ampere-hours (A h) or milliampere-hours (mA h), for example. In this regard, the coulomb counter 222 may be operable to estimate SOC of the rechargeable battery 210. In an exemplary embodiment, the coulomb counter 222 may be operable to estimate or determine the SOC of the rechargeable battery 210 utilizing battery dynamic data supplied from the data acquisition unit 220. In this regard, the SOC estimate may be calculated or determined utilizing instantaneous battery-specific factors with associated environmental conditions and instantaneous battery measurements supplied from the data acquisition unit 220.

The SOH engine 224 may comprise suitable logic, circuitry, interfaces and/or code that may be operable to estimate or calculate the SOH for the rechargeable battery 210 so as to evaluate battery performance. In this regard, the SOH engine 224 may calculate the SOH utilizing the instantaneous battery-specific factors with associated environmental conditions and instantaneous battery measurements from the data acquisition unit 220.

The state processor 226 may comprise suitable logic, circuitry, interfaces and/or code that may be operable to dynamically manage and control battery state of the rechargeable battery 210. For example, the state processor 226 may compare the SOH estimate from the SOH engine 224 with a SOH threshold value. In instances where the SOH estimate is less than the SOH threshold value, the state processor 226 may generate an unhealthy alert. In instances where the SOH estimate is equal or greater than the SOH threshold value, the state processor 226 may generate a healthy alert. In another example, the state processor 226 may compare the SOC estimate from the coulomb counter 222 with a desired load threshold value. In instances where the SOC estimate is less than the desired load threshold value, the state processor 226 may generate an alert for battery charging. In instances where the SOC estimate is greater than the desired load threshold value, the state processor 226 may generate an alert for battery discharging. In an exemplary embodiment, the battery state of the rechargeable battery 210 may be managed or controlled utilizing the instantaneous battery-specific factors with associated environmental conditions, instantaneous battery measurements, and long-term trends of the battery state.

The A/D unit 223 may comprise suitable logic, circuitry, interfaces and/or code that may be operable to convert an analog signal to corresponding digital signal.

The central processor unit 230 may comprise suitable logic, circuitry, interfaces and/or code that may be operable to coordinate and manage the power consumption within the BMS 200. The central processor unit 230 may provide application-specific information such as user pattern and power requirements during the operation of application platforms. The central processor unit 230 may communicate with the charging and discharging controller 204 and the data acquisition unit 220 to retrieve or receive the battery operating conditions of the rechargeable battery 210. In an exemplary embodiment, the central processor unit 230 may receive the battery operating conditions that are derived based on battery dynamic operating situations, for example, instantaneous battery-specific factors with associated environmental conditions, instantaneous battery measurements, and long-term trend analysis of the battery state. The received battery operating conditions may comprise capacity alarm and/or run-time battery state alarms, for example. The central processor unit 230 may manage the operation of the application platform based on the received battery operating conditions. The central processor unit 230 may manage the system power consumption and/or provide the user with information about present battery state and capabilities. In an exemplary embodiment, the central processor unit 230 may be operable to aggregate or accumulate dynamic battery data with associated environmental conditions for long-term trend analysis of the battery state. In this regard, the central processor unit 230 may run the battery-management software from the uploadable software unit 232 over the aggregated dynamic battery data. The central processor unit 230 may store the aggregated battery data with associated environmental conditions, and long-term trend analysis information for the rechargeable battery 210 into the nonvolatile memory 234. Furthermore, one or more processors of the BMS 200, for example, the state processor 226, the central processor unit 230, may be operable to estimate an ability of the rechargeable battery 210 to store and deliver electrical energy.

The uploadable software unit 232 may comprise suitable logic, circuitry, interfaces and/or code that may be operable to upload software such as the battery-management software to the central processor unit for long-term trend analysis of the rechargeable battery 210.

The nonvolatile memory 234 may comprise suitable logic, circuitry, interfaces and/or code that may enable storage of data and/or other information utilized by the central processor unit 230. In an exemplary embodiment, the stored information may comprise the battery-management software, aggregated battery data, long-term trend analysis information of the battery state, and the battery history profiles. The stored information may be downloaded to the downloadable unit 235 to support appropriate application platforms whenever needed. The nonvolatile memory 234 may retain stored information even in the absence of electrical power. The nonvolatile memory 234 may comprise flash, ROM, EPROM, EEPROM, and other types of nonvolatile memory.

The clock 236 may comprise suitable logic, circuitry, interfaces and/or code that may be operable to provide the BMS 200 with elapsed time information. For example, the clock 236 may generate interrupts to cause the central processor unit 230 to perform actions such as updating the present capacity value for the rechargeable battery 210.

In operation, the central processor unit 230 may manage and control power consumptions within the BMS 200 based on the battery operating conditions for the rechargeable battery 210 to support application platforms such as cell phone. The battery operating conditions may comprise information such as battery remaining life, how long it may take to charge the rechargeable battery 210, and/or battery history profiles, for example. The battery operating conditions may be determined based on the battery dynamic (operating) situations such as instantaneous battery-specific factors with associated environmental conditions, instantaneous battery measurements, and/or battery history profiles.

Figure 3:
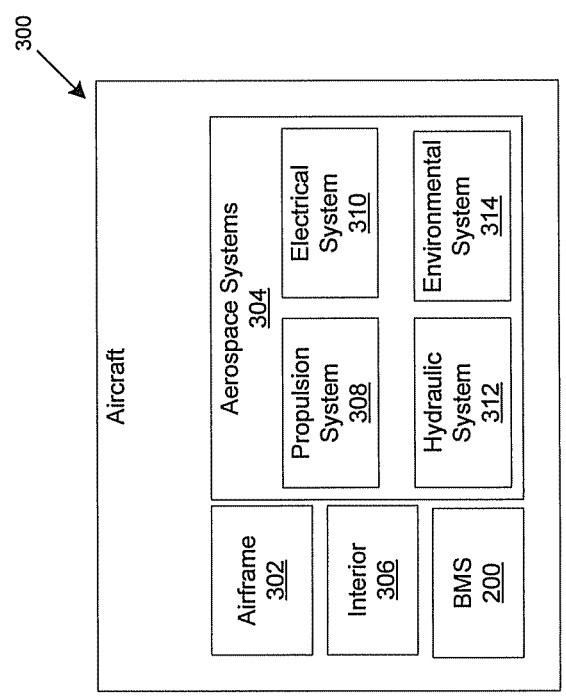
FIG. 3 is an illustration of an aircraft in which the battery life cycle management system of FIG. 2 may be utilized.

FIG. 3 is an illustration of an aircraft in which the battery life cycle management system of FIG. 2 may be utilized. Referring to FIG. 3, there is shown an aircraft 300, which comprises an airframe 302, an interior 396, the BMS 200, and aerospace systems 304. The aerospace systems 304 may comprise a propulsion system 308, an electrical system 310, a hydraulic system 312 and an environmental system 314. The BMS 200 may be configured to output a current to support at least a portion of operation of various aerospace systems in the aircraft 300, for example, the propulsion system 308, the electrical system 310, the hydraulic system 312 and/or the environmental system 314.

Figure 4:
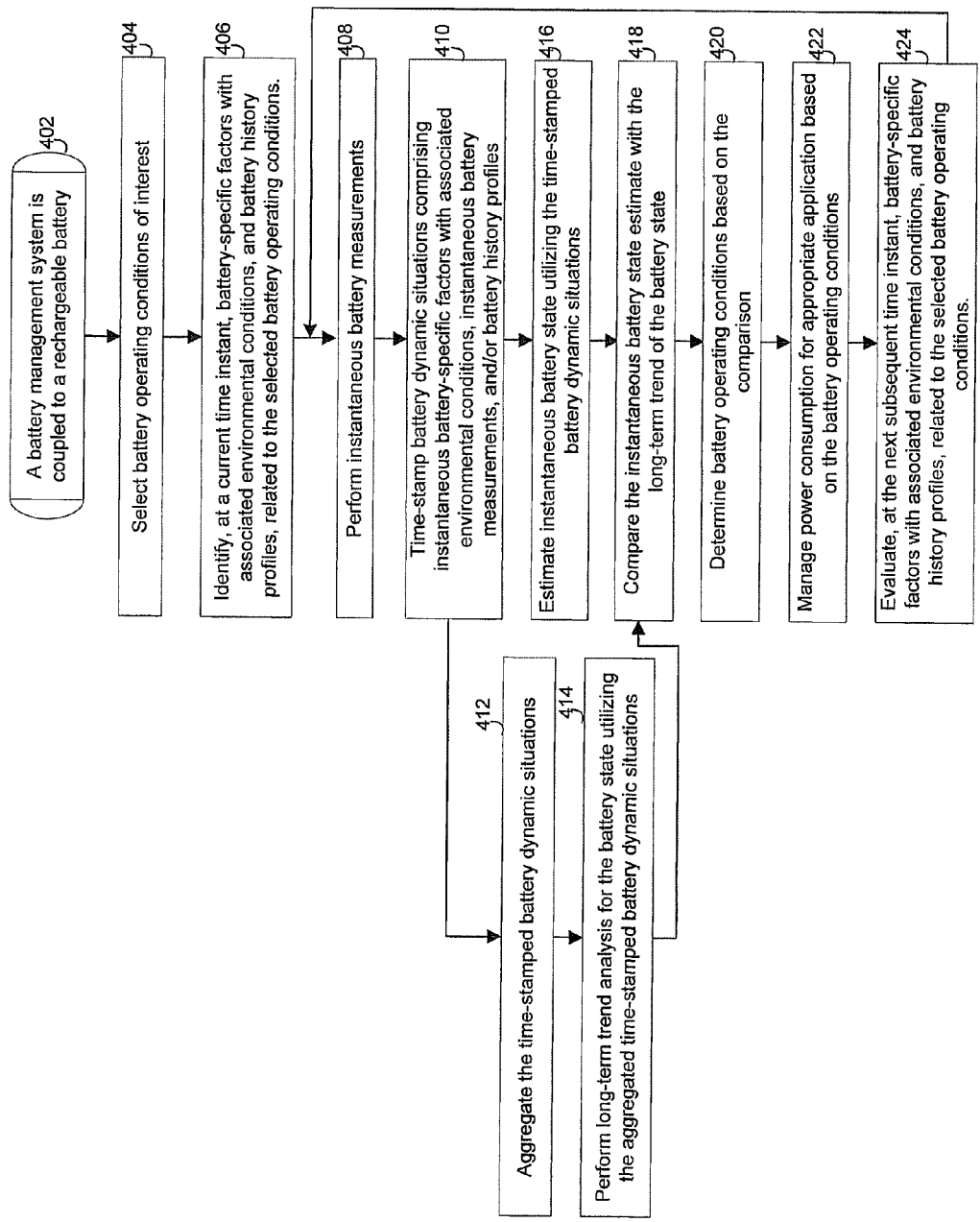
FIG. 4 is a flow diagram that illustrates exemplary steps performed for battery life cycle management, in accordance with an illustrative embodiment.

FIG. 4 is a flow diagram that illustrates exemplary steps performed for battery life cycle management, in accordance with an illustrative embodiment. Referring to FIG. 4, in step 402, the rechargeable battery 210 is coupled to the BMS 200. The exemplary steps start with step 404, where the central processor unit 230 may be operable to select battery operating conditions of interest, for example, remaining battery capacity, remaining battery life based on a specific discharge rate, and/or whether the rechargeable battery 210 may provide a specified amount of additional power to perform a task. In step 406, at a current time instant, the BMS 200 may identify or evaluate battery-specific factors with associated environmental conditions, and battery history profiles, related to the selected battery operating conditions. In step 408, the data acquisition unit 220 may perform instantaneous battery measurements such as instantaneous measurements of battery current, voltage and/or power for the selected battery operating conditions. In step 410, the BMS 200 may time stamp battery dynamic situations that comprise information such as, for example, instantaneous battery-specific factors with associated environmental conditions, instantaneous battery measurements, and/or battery history profiles. The resulting time-stamped battery dynamic situations may be forwarded to step 412 and step 416, respectively.

In step 412, the BMS 200 may be operable to aggregate the time-stamped battery dynamic situations. In step 414, the BMS 200 may be operable to perform long-term trend analysis of the battery state utilizing the aggregated time-stamped battery dynamic situations.

In step 416, the BMS 200 may be operable to estimate an instantaneous battery state utilizing the time-stamped battery dynamic situations captured at the current time instant. In step 418, the BMS 200 may update the instantaneous battery state estimate by comparing with the long-term trend of the battery state for the rechargeable battery 210. In step 420, the BMS 200 may be operable to determine battery operating conditions based on the comparison. For example, in instances where the difference between the instantaneous battery state estimate and the long-term trend of the battery state is less than a pre-determined threshold value, the BMS 200 may utilize the instantaneous battery state estimate to determine the battery operating conditions. In instances where the difference between the instantaneous battery state estimate and the long-term trend of the battery state is equal to or greater than the pre-determined threshold value, the BMS 200 may utilize the long-term trend of the battery state to determine the battery operating conditions. In step 422, the BMS 200 may be operable to manage or control system power consumption for appropriate application platforms based on the determined battery operating conditions. In step 424, the BMS 200 may continue to evaluate battery-specific factors with associated environmental conditions and battery history profiles, which are related to the selected battery operating conditions, at the next subsequent time instant. The exemplary steps may return to step 408 to continue the process.

In various exemplary aspects of the apparatus (system) and method for battery life cycle management, the BMS 200 that comprises a battery such as the rechargeable battery 210 may be operable to identify battery-specific factors with associated environmental conditions, and battery history profiles, related to battery operating conditions of interest at a current time instant. The data acquisition unit 220 may be operable to instantaneously measure current, voltage, and/or power of the rechargeable battery 210. The resulting instantaneous battery measurements, the battery-specific factors with associated environmental conditions, and the battery history profiles may be utilized to form assessments of the battery at the current time instant. The battery assessments may be time stamped to be utilized for an instantaneous battery state estimate of the rechargeable battery 210. The time stamped battery assessments at the current time instant may be aggregated to form a life cycle assessment. The resulting aggregated battery assessments may be utilized for long-term trend analysis for the battery state. The BMS 200 may compare the instantaneous battery state estimate with the long-term trend analysis. The instantaneous battery state estimate may be updated based on the comparison. The BMS 200 may utilize the updated battery state estimate to determine the battery operating conditions. The power consumptions within the BMS 200 may be managed for appropriate application platforms based on the determined battery operating conditions. The battery state at a different time instant may vary depending on the battery dynamic situations corresponding to the different time instant.

In various exemplary aspects of the apparatus (system) and method for battery life cycle management, the BMS 200 that is deployed in the aircraft 300 and is coupled to the rechargeable battery 210 may comprise various components such as the nonvolatile memory 234, the state processor 226, the central processor unit 230, and the data acquisition unit 220. The nonvolatile memory 234 is coupled to the central processor unit 230. The data acquisition unit 220 may be communicatively coupled to the state processor 226 and the central processor unit 230. The data acquisition unit 220 may comprise an interface to the rechargeable battery 210 to be life cycle managed. The data acquisition unit 220 may receive data that may comprise a plurality of current time instant operating factors associated with the rechargable battery 210. The BMS 200 may access a historical profile associated with the rechargable battery 210. The historical profile may be stored in the nonvolatile memory 234 coupled to the central processor unit 230. The BMS 200 may estimate a state of the rechargable battery 210 utilizing the received data and the historical profile associated with the rechargable battery 210. The BMS 200 may measure a plurality of currents, voltages and impedances associated with the rechargable battery 210 at a current time instant. In this regard, the BMS 200 may measure a plurality of cell load voltages, cell open circuit voltages, and/or cell loaded DC impedances associated with the rechargable battery 210. The BMS 200 may be operable to perform long-term trend analysis for the battery state utilizing the received data and the historical profile. The BMS 200 may be operable to time stamp the received data for utilizing in the historical profile for the rechargable battery 210 and the long-term trend analysis of the state of the rechargable battery 210. The estimate of the battery state for the rechargable battery 210 may comprise at least one of estimating a charge level for the rechargable battery 210, estimating an ability of the rechargable battery 210 to store and deliver electrical energy, and/or estimating a life span for the rechargable battery 210. The battery state estimate may also comprise estimating at least one of remaining battery capacity, how much battery operating time is left, remaining battery life based on a specific discharge rate, a capacity for recharging of said battery, whether said battery provides adequate power for an additional load, and whether said battery may provides a specified amount of additional power to perform a task. The BMS 200 may utilize the battery state estimate to manage operation of the rechargable battery 210, for example, charging and discharging operations. The BMS 200 may also receive or collect data relating to an environment in which the rechargable battery 210 operates. For example, the received data may comprise temperatures and/or temperature gradients experienced by the rechargable battery 210. The battery state at a time instant other than the current time instant may be estimated utilizing the received data and the historical profile.

Another embodiment may provide a machine and/or computer readable storage and/or medium, having stored thereon, a machine code and/or a computer program having at least one code section executable by a machine and/or a computer, thereby causing the machine and/or computer to perform the steps as described herein for an apparatus (system) and method for battery life cycle management.

Accordingly, the presently described embodiments may be realized in hardware, software, or a combination of hardware and software. Alternatively, the described embodiments may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

In addition, the presently described embodiments may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the embodiments have been described with reference to certain embodiments, it will be understood by those skilled in the art that various changes may be made and equivalents may be substituted without departing from the spirit and scope. In addition, many modifications may be made to adapt a particular situation or material to the teachings herein without departing from its scope. Therefore, it is intended that the presently described embodiments not be limited to the particular embodiments disclosed, but that they include all embodiments falling within the scope of the appended claims.

What is claimed is:

1. A method for life cycle management of a battery, said method comprising:
    receiving data at a battery life cycle management system coupled to said battery, wherein said data comprising a plurality of current time instant operating factors associated with said battery;
    estimating a current state of said battery using the received data;
    accessing a historical profile associated with said battery, wherein the historical profile comprises historical data detected over a period of time;
    performing a long-term trend analysis of said battery using the historical profile to determine a long-term trend battery state;
    comparing the current state of the battery and the long-term trend battery state;
    estimating a state of said battery using the comparison between the current state of the battery and the long-term trend battery state; and
    managing operation of said battery based on said estimated state of said battery, wherein managing operation of said battery comprises performing one or more of charging and discharging cycles for said battery in response to said estimated state of said battery.

2. The method according to claim 1, wherein receiving data comprises measuring a plurality of currents, voltages and impedances associated with said battery at a current time instant.

3. The method according to claim 2, wherein measuring a plurality of currents, voltages, and impedances comprises measuring a plurality of cell load voltages, cell open circuit voltages, and cell loaded DC impedances associated with said battery.

4. The method according to claim 1, comprising time stamping said received data for utilizing in one or more of said historical profile for the battery and said long-term trend analysis of said battery.

5. The method according to claim 1, wherein estimating a state of said battery comprises at least one of estimating a charge level for said battery, estimating an ability of said battery to store and deliver electrical energy, and/or estimating a life span for said battery.

6. The method according to claim 1, wherein receiving data comprises receiving data relating to an environment in which said battery operates.

7. The method according to claim 6 wherein said data relating to said environment comprises temperatures and/or temperature gradients experienced by said battery.

8. The method according to claim 1, comprising estimating a battery state for said battery at a time instant other than said current time instant utilizing said received data and said historical profile.

9. A battery life cycle management system, the system comprising:
one or more processors;
a memory communicatively coupled to said one or more processors; and
at least one data acquisition unit communicatively coupled to said one or more processors and comprising an interface to a battery to be life cycle managed, said one or more processors being operable to:
receive data from said at least one data acquisition unit, said data comprising a plurality of current time instant operating factors associated with said battery;
estimate a current state of said battery using the received data;
access a historical profile associated with said battery stored within said memory, wherein the historical profile comprises historical data detected over a period of time;
perform a long-term trend analysis of said battery using the historical profile to determine a long-term trend battery state;
compare the current state of the battery and the long-term trend battery state;
estimate a state of said battery using the comparison between the current state of the battery and the long-term trend battery state; and
manage operation of said battery based on the estimated state of said battery, wherein managing operation of said battery comprises performing one or more of charging and discharging cycles for said battery in response to said estimated state of said battery.

10. The system according to claim 9, wherein said one or more processors are operable to receive measurements of currents, voltages, and impedances associated with said battery at a current time instant via said at least one data acquisition unit.

11. The system according to claim 9, wherein said one or more processors are operable to:
time stamp said received data.

12. The system according to claim 9, wherein to estimate said state of said battery said one or more processors are operable to estimate a charge level for said battery, estimate an ability of said battery to store and deliver electrical energy, and estimate a life span for said battery.

13. The system according to claim 9, wherein said one or more processors are operable to utilize data relating to an environment in which said battery operates as a factor when estimating said state of said battery.

14. The system according to claim 9, wherein to estimate said state of said battery, said one or more processors are operable to estimate at least one of remaining battery capacity, how much battery operating time is left, remaining battery life based on a specific discharge rate, a capacity for recharging of said battery, whether said battery provides adequate power for an additional load, and whether said battery provides a specified amount of additional power to perform a task.

15. An aircraft comprising:
at least one battery deployed therein;
at least one unit within said aircraft operable to utilize power supplied by said battery during at least a portion of an operating cycle associated with said unit; and
a battery life cycle management system coupled to said at least one battery and operable to receive data comprising a plurality of current time instant operating factors associated with said at least one battery, estimate a current state of said battery using the received data, access a historical profile associated with said at least one battery stored within said battery life cycle management system, perform a long-term trend analysis of said battery using the historical profile to determine a long-term trend battery state, compare the current state of the battery and the long-term trend battery state, estimate a state of said at least one battery using the comparison between the current state of the battery and the long-term trend battery state, and manage operation of said at least one battery based on said estimated state of said battery, wherein managing operation of said battery comprises performing one or more of charging and discharging cycles for said battery in response to said estimated state of said battery, and wherein the historical profile comprises historical data detected over a period of time.

16. The aircraft of claim 15 wherein to estimate a state of said battery, said battery life cycle management system is configured to estimate a charge level for said battery, estimate an ability of said battery to store and deliver electrical energy, and estimate a life span for said battery.

17. The aircraft of claim 15 wherein said battery life cycle management system is configured to:
utilize data relating to an environment in which said at least one battery operates as a factor when estimating said state of said battery; and
estimate at least one of remaining battery capacity, remaining battery operating time, remaining battery life based on a specific discharge rate, a capacity for recharging of said at least one battery, whether said at least one battery provides adequate power for an additional load, and whether said at least one battery provides a specified amount of additional power to perform a task.

18. The method of claim 1, wherein the historical profile comprises records of cycle count, a user pattern, maintenance requirements, a number of discharges, a number of charge-discharge cycles, a difference between an actual battery capacity and a discharge capacity, an occurrence of a refreshment discharge since a previous refreshment discharge, or any combination thereof.

* * * * *